United States Patent [19]

McPherson

[11] Patent Number: 4,650,922
[45] Date of Patent: Mar. 17, 1987

[54] THERMALLY MATCHED MOUNTING SUBSTRATE

[75] Inventor: Joe W. McPherson, Richmond, Tex.

[73] Assignee: Texas Instruments Incorporated, Dallas, Tex.

[21] Appl. No.: 710,258

[22] Filed: Mar. 11, 1985

[51] Int. Cl.⁴ ............................................. H01L 23/14
[52] U.S. Cl. ................................. 174/52 FP; 29/588; 357/74
[58] Field of Search .................... 174/52 FP, 68.5; 357/74; 29/588

[56] References Cited

U.S. PATENT DOCUMENTS

| | | | |
|---|---|---|---|
| 3,391,016 | 7/1968 | McCrary, Jr. et al. | 427/249 |
| 3,683,105 | 8/1972 | Shamash et al. | 174/52 FP X |
| 4,283,464 | 8/1981 | Hascoe | 428/594 |
| 4,370,421 | 1/1983 | Matsushita et al. | 501/89 X |
| 4,517,584 | 5/1985 | Matsushita et al. | 357/80 |
| 4,581,279 | 4/1986 | Sugishita et al. | 174/68.5 X |

Primary Examiner—Arthur T. Grimley
Assistant Examiner—D. A. Tone
Attorney, Agent, or Firm—John G. Graham; Rodney M. Anderson

[57] ABSTRACT

A mounting substrate (10) is formed from a platelet of graphite (22) conformally coated with a layer of silicon carbide (24). A layer of silicon dioxide (25) is disposed thereon and a chip (16) mounted onto the substrate (10). The silicon carbide has a thermal expansion coefficient that is essentially equal to silicon in addition to a high thermal conductivity.

20 Claims, 4 Drawing Figures

THERMALLY MATCHED MOUNTING SUBSTRATE

TECHNICAL FIELD OF THE INVENTION

The present invention pertains in general to extraction of heat from semiconductor chips and, more particularly to mounting techniques for high density semiconductor chips.

CROSS REFERENCE TO RELATED APPLICATIONS

This application is related to Ser. No. 710,259 filed Mar. 11, 1985.

BACKGROUND OF THE INVENTION

Large scale integration of circuits into semiconductor chips has resulted in very dense circuits with relatively small geometries. As the geometries are decreased, the operating temperature of the chip increases. This is an additive effect due to the large number of elements on the chip that dissipate heat and the proximity thereof. In a circuit with low density, this heat is easily extracted. However, when the density increases, this additive effect is exacerbated since the amount of heat generated per unit of square area increases without a corresponding decrease in the thermal resistance between the circuit and the heat sink.

Conventional packaging techniques for low cost semiconductor devices utilize some form of mounting substrate which defines a lead pattern for bonding of the chip thereto and also a mounting surface. Depending upon the type of chip to be mounted on the surface and the application thereof, the thermal properties of the mounting surface can vary. For example, in consumer applications, the temperature extremes that a packaged chip will be subjected to are less than that for a military qualified package. Therefore, the thermal match between the chip and the mounting surface for the military application is of greater importance. If the thermal expansion coefficient of the mounting circuit varies greatly from that of the chip, the chip can be subjected to undesirable stresses during temperature cycling. Therefore, it is desirable to have the thermal expansion coefficients of both the chip and the mounting surface match as close as possible.

Another factor that is desirable for the mounting surface is a high thermal conductivity. This is necessary to reduce the temperature drop between the temperature on the active surface of the chip and the peripheral sides of the mounting surface. By reducing the surface temperature of the chip, a higher reliability is realized. Present mounting surfaces utilize such materials as aluminum oxide and various alloys. The aluminum oxide has relatively good thermal conductivity but its thermal expansion coefficient is approximately 60% greater then that of silicon, the conventional material from which semiconductor chips are fabricated. If a thermal expansion mismatch exists between the silicon chip and the mounting surface, severe stresses can be generated due to large temperature variations during temperature cycling of a mounted device. These stresses can cause cracking in the semiconductor chip if not controlled.

In view of the various requirements for mounting surfaces, there exists a need for a mounting surface which provides both adequate thermal conduction properties and also provides a thermal expansion coefficient that approximates the thermal expansion coefficient of the semiconductor chip mounted thereon.

SUMMARY OF THE INVENTION

The present invention disclosed and claimed herein comprises a mounting surface for mounting a silicon semiconductor chip. The mounting surface includes a substrate having a thermal expansion coefficient approximately the thermal expansion coefficient of silicon. This substrate is manufactured from silicon carbide by conformally coating a graphite platelet with silicon carbide. An interconnect pattern is formed on one surface of the silicon carbide substrate and a chip adhered to a select portion of the pattern. The thermal resistance of the select portion is minimal between the chip and the substrate such that heat flowing between the chip and the substrate is not inhibited.

In yet another embodiment of the present invention, the graphite platelet portion of the substrate has a topological pattern formed therein. The conformal coating of silicon carbide reflects this topological pattern. This topological pattern defines a well for receiving the semiconductor chip such that the upper surface of the chip is lower relative to the remaining portions of the interconnect pattern.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
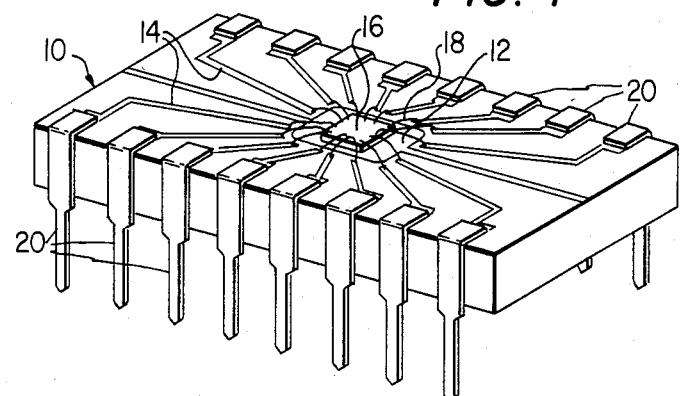
FIG. 1 illustrates a perspective view of the semiconductor chip mounted on a substrate with a defined lead pattern.

Referring now to FIG. 1, there is illustrated a perspective view of a mounting substrate 10 which has a lead pattern defined thereon. The lead pattern is comprised of a mounting pad 12 and a plurality of metallic leads 14 which radiate outward from the mounting pad 12 and are electrically isolated therefrom. The leads 14 are either deposited on the substrate 10 by vacuum deposition techniques or they can be screened on. A semiconductor chip 16 is mounted on the mounting pad 12 and interconnected to the leads 14 through bonding wires 18. Leads 20 are attached to the leads 14 at the peripheral edges of the substrate 10 and are disposed downward at a right angle to the surface of the substrate 10. The mounting configuration illustrated in FIG. 1 is that of a sixteen pin dual-in-line package (DIP).

Figure 2:
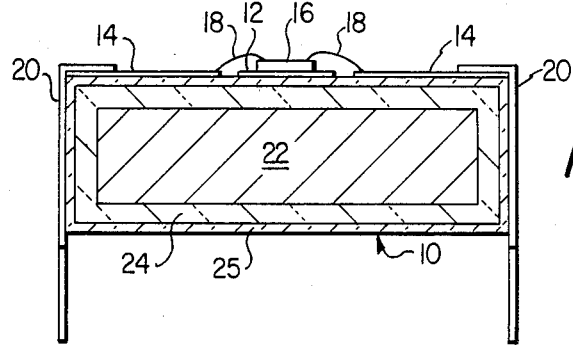
FIG. 2 illustrates a cross-sectional diagram of the substrate.

Referring now to FIG. 2, there is illustrated a cross-sectional diagram of the mounting substrate 10 and the chip 16. Although not shown, a lid is utilized to cover the chip 16 and isolate it from the external environment. The cover is attached with conventional adhesives to provide a certain degree of hermeticity. In operation, the semiconductor chip 16 operates as a heat source.

The chip 16 is mounted onto the mounting pad 12 with an adhesive such as gold preform or a silver filled polyimide. This is a low thermal resistance material which provides good heat conduction between the chip 16 and the mounting pad 12. Since the mounting pad 12 is relatively thin and is deposited onto the mounting substrate 10, this provides an inherently low thermal resistance path for heat dissipation.

The mounting substrate 10 is operable to provide a sufficient surface area at a lower temperature than the surface temperature of the chip 16. If possible, it would be desirable to have the surface temperature on the active portion of the chip at the same temperature as the peripheral sides of the mounting substrate 10. However, there is always a finite amount of thermal resistance between the peripheral sides of the mounting substrate 10 and the active surface of the chip 16. To minimize the thermal resistance between the chip 16 and the exterior surface of the mounting substrate 10, a low thermal resistance material is utilized. The thermal resistance of the mounting substrate 10 will determine the temperature drop between the active surface of the chip 16 and the thermal surfaces of the mounting substrate 10. As long as the thermal resistance between the surface of chip 16 and the exterior surfaces of the mounting substrate 10 is low, the temperature difference therebetween is minimal. Since the mounting surface 10 has a significantly larger surface area than that of the chip 16, a significant increase in the effective surface area for heat dissipation is realized. By increasing the effective area, the amount of heat in watts per square centimeter generated by the chip 16 can be spread out over a large area and effectively extracted therefrom which translates to a reduction in chip temperature and a corresponding increase in chip reliability.

If the temperature difference between the active surface of the chip 16 and the peripheral surfaces of the mounting substrate is not minimized, reliability problems may occur during device operation. By fabricating the mounting substrate 10 from a material with a low thermal resistance, reliability is increased due to the lower surface temperature at the chip 16.

An important consideration during temperature cycling is relative expansion and contraction between the chip 16 and the mounting substrate 10. Silicon typically has a thermal coefficient of expansion of $4.2 \times 10^{-6}/°C$. If the mounting substrate 10 does not have a thermal expansion coefficient similar to that of silicon, the chip 16 will be stressed. This stress can result in reliability problems in the form of cracking, etc. Therefore, it is desirable to have the mounting substrate 10 manufactured from a material that has a similar thermal expansion coefficient to that of silicon or whatever material the chip 16 is fabricated from. In addition to the thermal expansion coefficient, it is still important to maintain a high thermal conductivity coefficient.

In the preferred embodiment, the semiconductor material utilized for the chip is silicon and the material utilized for the mounting substrate 10 is a platelet of graphite 22 with a conformal coating of silicon carbide 24. This material is manufactured by Texas Instruments Incorporated as a conventional process which is described in U.S. Pat. Nos. 3,250,322 and 3,391,016 issued to J. W. McClarey, et al. and U.S. Pat. No. 3,317,356 issued to W. R. Clendinning, and all assigned to Texas Instruments Incorporated. Especially, the platelet of graphite 22 is disposed in a vacuum chamber and silicon carbide deposited thereon through chemical vapor deposition techniques. The silicon carbide is formed from the reaction of silicon tetra-chloride with the pyrolysis of hydrocarbon. The graphite platelet 22 provides a substrate for this deposition.

The graphite platelet 22 provides a workable material for forming any configuration necessary for the mounting substrate 10. The silicon carbide, on the other hand, is relatively difficult to machine, polish, etc., thus making it a relatively expensive material when existing by itself. The thermal expansion coefficient of silicon carbide is $4.5 \times 10^{-6}/°C$. with a thermal conductivity of from 1-watt/cm°C. to 5-watt/cm per °C. Graphite has a thermal expansion coefficient of $6.3 \times 10^{-6}/°C$. and a thermal conductivity coefficient of 1.7 watt/cm°C.

Silicon carbide is a binary alloy consisting of the elements silicon and carbon. A strong covalent bonding of these light elements in a cubic crystalline structure produces a very thermally conductive material through phonon conduction. A phonon is defined as a quantum of elastic energy. By comparison, heat transfer through a metallic substance is primarily performed by the electrons. While the diamond phase of carbon is an excellent thermal conductor at 20 watt/cm °C. (some 5 times better than copper), the very high cost and low thermal expansion coefficient ($1.2 \times 10^{-6}/°C$.) make it unsuitable for low cost mounting substrate use with silicon chips.

The use of silicon carbide for the mounting substrate 10 provides an excellent thermal match to the silicon material of the chip 16 and also provides a high thermal conductivity coefficient. In addition, the silicon carbide is a semi-insulating material which is important relative to the prevention of electrical shorting of wires 18, leads 14, and leads 20 in the event that they touch the surface. Silicon carbide is also noncorrosive, thus eliminating any corrosion problems between the mounting substrate 10 and the other metallic parts, such as the bonding wires, the leads 20 and the chip metallization. Another characteristic of silicon carbide that is desirable for the manufacturing environment is the hard surface. The surface is smooth providing for reliable deposition of the leads 14 and the mounting pad 12, the surface being highly scratch resistant. From a handling standpoint, there is of some importance. Also, the silicon carbide provides a very low alpha-particle emitting surface for chip attachment. This comes from the fact that the chemical vapor deposition of silicon carbide can potentially be free of alpha-emitting trace elements.

To further improve isolation between the silicon carbide layer and the mounting pad 12 and leads 14, a thin layer of dielectric material such as silicon dioxide 25 is deposited over the substrate 10. This provides excellent isolation without degrading either the thermal conductivity properties or the relative thermal expansion coefficients of the various layers.

Figure 3:
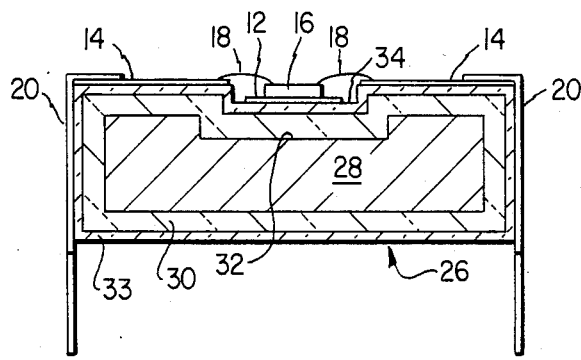
FIG. 3 illustrates a cross-sectional view of an alternate embodiment of the mounting surface with the chip mounted in a well.

Referring now to FIG. 3, there is illustrated an alternate embodiment of the mounting substrate, wherein like numerals refer to like parts in the various figures. A mounting substrate 26 is provided which is comprised of a graphite platelet 28 covered with a conformal coating 30 of silicon carbide and a layer of silicon dioxide. The graphite platelet 28 has a well 32 defined therein for receiving the semiconductor chip 16. Since the silicon carbide layer 30 is conformal, a well 34 is formed therein. The mounting pad 12 is disposed in the well 34 such that the surface of the chip 16 is lowered with respect to the remaining portion of the circuit. The remaining portions of the circuit are the lead frames 14 which are mounted exterior to the well 34 such that they are on a higher plane than mounting pad 12.

By utilizing graphite for the platelet 28, the well 32 can be easily machined therein. However, graphite has some undesirable properties such as "flaking" and is not suitable for use as a mounting surface for the silicon chip 16. As described above, silicon carbide is a desirable surface but some of its undesirable properties are its lack of "workability". Therefore, the composite substrate allows any type of topological pattern to be disposed on any surface of the graphite platelet 28 and then the conformal coating 30 of silicon carbide disposed thereon.

Figure 4:
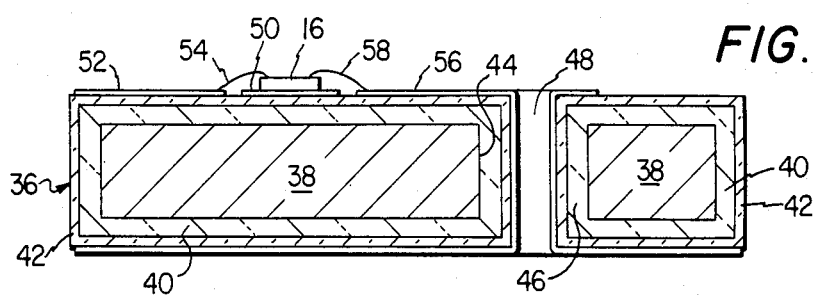
FIG. 4 illustrates an alternate embodiment of the present invention with an orifice disposed through the substrate.

Referring now to FIG. 4, there is illustrated an alternate embodiment of the present invention for mounting of the chip 16. A mounting substrate 36 is provided which is comprised of a graphite platelet 38, a conformal coating of silicon carbide 40 and a layer of silicon dioxide 42. An orifice 44 is disposed through the graphite platelet with the silicon carbide layer 40 extending downward therethrough in a portion 46. The orifices 44 are formed in the graphite platelet 38 during fabrication thereof and then the platelet 38 conformally coated with the silicon carbide to allow coating of the orifice 44 with the portion 46. This forms an overall orifice 48 between the upper and lower surfaces of the mounting substrate 36.

The chip 16 is mounted on a mounting pad 50 which is isolated from the silicon carbide layer 40 by the silicon dioxide layer 42. The chip 16 is bonded to a circuit interconnect 52 with a bond wire 54. The circuit interconnect 52 is a layer of metal deposited on the surface of the silicon dioxide layer 42 and is operable to interconnect with other portions of the circuit (not shown). In addition, a layer of metallization 56 is provided which is interconnected to the chip 16 with a bonding wire 58. The layer of metallization 56 is deposited on the upper surface of the mounting substrate 36, the portion 46 of the silicon carbide layer 40 that conformally coats the orifice 44 in the graphite platelet 38 and also the lower portion of the mounting substrate 36. This is termed a "plated through hole". This allows electrical communication of the upper surface of the mounting substrate 36 and the lower surface thereof. For example, the metallization 56 could represent a ground plane. With the use of the orifices 44 disposed in the graphite platelet 38, the ground plane can be disposed anywhere on the surface of the mounting substrate 36 by disposing an orifice in the graphite platelet 38. This reduces the electrical conduction path and the inductance associated therewith. This is important for high speed switching applications, video applications and high frequency operation.

In summary, there has been provided a composite substrate for mounting of a semiconductor chip. The composite substrate is comprised of a platelet of graphite with a conformal coating of silicon carbide thereon. The silicon carbide provides a thermal expansion coefficient essentially equal to that of a silicon semiconductor chip. The metallization pattern for interconnection with the chip is disposed on the surface of the semiconductor chip with an insulating layer disposed between the chip and the substrate.

Although the preferred embodiment has been described in detail, it should be understood that various changes, substitutions and alterations can be made therein without departing from the spirit and scope of the invention as defined by the appended claims.

What is claimed is:

1. Apparatus for mounting a silicon semiconductor chip, comprising:
    a substrate having a thermal expansion coefficient approximating the thermal expansion coefficient silicon;
    said substrate comprising a graphite platelet having a conformal coating of silicon carbide;
    an interconnect pattern formed on said substrate; and
    means for adhering a chip to a select portion of said pattern, the thermal resistance of said means for adhering being minimal.

2. The apparatus of claim 1 wherein said substrate has a surface area larger than the surface area of the chip.

3. The apparatus of claim 1 wherein said interconnect pattern comprises a deposited metalized pattern on the surface of said substrate with a select area for adhering the chip to by said adhering means.

4. The apparatus of claim 1 and further comprising a topological pattern formed in said graphite platelet, said conformal coating of silicon carbide conforming to said topological pattern such that said topological pattern is reflected in the surface of said substrate.

5. The apparatus of claim 4 wherein said select portion of said topological pattern forms a well, the depth of said well being substantially the thickness of the semiconductor chip to be mounted thereupon puls the thickness of said means for adhering.

6. The apparatus of claim 1 wherein said substrate further comprises an orifice disposed therethrough with an interconnect pattern disposed on the side of said substrate opposite the side to which the chip is to be adhered, said orifice having an interconnect pattern disposed on the inner surface thereof for interconnecting both sides of said substrate.

7. The apparatus of claim 1 and further comprising insulation means disposed between said substrate and said interconnect pattern.

8. An apparatus for mounting a silicon semiconductor chip, comprising:
    a substrate having a thermal expansion coefficient approximately the thermal expansion coefficient of the chip;
    said substrate manufactured from a graphite platelet conformally coated with silicon carbide;
    a mounting pad disposed in a predetermined location on the surface of said substrate for mounting of the chip thereto;
    means for adhering the chip to said mounting pad;
    an electrically conductive interconnect pattern disposed on the substrate for allowing the chip to interface with circuitry external to said substrate; and
    means for interfacing the chip with said interconnect pattern.

9. The apparatus of claim 8 and further comprising a topological pattern formed in said graphite platelet, said silicon carbide coating conforming to said topological pattern.

10. The apparatus of claim 9 wherein said topological pattern defines a well in the surface of said substrate adjacent said mounting pad such that the upper surface of the chip is disposed closer to the plane of said interconnect pattern.

11. The apparatus of claim 8 and further comprising:
    a metalized pattern disposed on the opposite side of said substrate from said interconnect pattern;

an orifice disposed through said substrate to interconnect both sides thereof and at a selected location with respect to said interconnect pattern;

said orifice formed in said graphite platelet and conformally coated with silicon carbide such that a continuous coating of silicon carbide exists between the upper surface and lower surface and the inner sides of said orifice; and a layer of metallization disposed on the innersurfaces of said orifice for interconnecting said metalized pattern on the lower surface of said substrate and a select portion of said metalized patterns.

12. The apparatus of claim 8 and further comprising a layer of insulating material disposed between said mounting pad and said substrate and also between said metalized pattern and said substrate.

13. The apparatus of claim 12 wherein said insulating layer comprises silicon dioxide.

14. A method for mounting a semiconductor chip, comprising:

disposing a mounting pad on a substrate having a thermal expansion coefficient approximating the thermal expansion coefficient of the chip;

the substrate manufactured from a graphite platelet having a layer of silicon carbide disposed on the surface thereof;

disposing an interconnect pattern on the surface of the substrate; and adhering the chip to the mounting pad, the mounting pad having a minimal thermal resistance.

15. The method of claim 14 and further comprising disposing an insulating layer between the mounting pad and the substrate and also between the interconnect pattern and the substrate.

16. The method of claim 14 and further comprising forming a topological pattern in the graphite platelet prior to conformally coating the substrate with the silicon carbide such that the topological pattern is reflected in the surface of the substrate.

17. The method of claim 14 and further comprising:

disposing a layer of metallization on the lower surface of the substrate opposite the chip;

forming an orifice in the substrate; and forming a layer of metal on the innersurfaces of the orifice to allow interconnection between the metalized undersurface of the substrate to a select portion of the interconnect pattern.

18. A substrate for mounting a silicon semiconductor chip, comprising:

a body of graphite conformally coated with silicon carbide, said conformally coated body having a surface;

a mounting pad disposed in a predetermined location on said surface for mounting the chip thereto; and an electrically conductive interconnect pattern disposed on said surface for allowing the chip to interface with circuitry external to said substrate.

19. A substrate as claimed in claim 18, wherein a select portion of said surface is adapted to receive a cap to be placed over said mounting pad after said chip is mounted thereupon.

20. A substrate as claimed in claim 18, wherein said body of graphite has an orifice disposed therethrough; and wherein said conformal coating of silicon carbide covers the inner surface of said orifice.

* * * * *